United States Patent [19]

Rabinovich et al.

[11] Patent Number: 4,535,283

[45] Date of Patent: Aug. 13, 1985

[54] DEVICE FOR CONVERSION OF NON-ELECTRICAL QUANTITY INTO ELECTRICAL SIGNAL

[75] Inventors: Lev M. Rabinovich; Albert Y. Jurovsky; Jury M. Brodkin; Viktor A. Puginsky; Georgy G. Iordan; Vilen I. Serdjukov; Vadim K. Sukhodolets; Galina V. Tikhnova; Galina M. Golikova, all of Moscow, U.S.S.R.

[73] Assignee: Gosudarstvenny Nauchno-Issledovatelsky Institut Teploenergeticheskogo Priborostroenia, Moscow, U.S.S.R.

[21] Appl. No.: 485,631

[22] Filed: Apr. 18, 1983

[51] Int. Cl.³ .............................................. H03H 9/02
[52] U.S. Cl. .................................... 323/365; 73/719; 73/861.48
[58] Field of Search .................. 323/364–369, 323/268, 269, 274, 279, 280; 324/DIG. 1, 65 R; 73/719, 720, 721, 725, 726, 727, 861.48, 861.51, 862.63, 862.67

[56] References Cited

U.S. PATENT DOCUMENTS 3,646,815  3/1972  Martin et al. .......................... 73/727
4,362,060  12/1982  Okayama et al. ..................... 73/721
4,419,620  12/1983  Kurtz et al. .......................... 323/367

FOREIGN PATENT DOCUMENTS 430277 of 1977 U.S.S.R. .

Primary Examiner—Peter S. Wong
Assistant Examiner—Judson H. Jones
Attorney, Agent, or Firm—Burgess, Ryan & Wayne

[57] ABSTRACT

Device for conversion of a nonelectrical quantity into an electrical signal comprises measuring and compensating bridge circuits whose supply arms are connected to a power supply. A nonelectrical quantity like strain, force or pressure acts on the input of the measuring bridge circuit whose output is coupled to the input of a measuring circuit. The effect of destabilizing factors, such as temperature, electromagnetic field or aging of device components, is reduced by a suitable compensating bridge circuit whose output is connected to the input of a correction circuit. The measuring bridge circuit is one arm of the compensating bridge circuit. The correction circuit has differential outputs coupled to adjustable dividers whose number is equal to the number of compensating couplings introduced. Outputs of the dividers are connected to a displacement unit and to a device functional characteristic scaling circuit. The device also comprises an adjustable bridge circuit to compensate nonlinearity of the device functional characteristic and a unit for changing the steepness of said functional characteristic.

6 Claims, 2 Drawing Figures

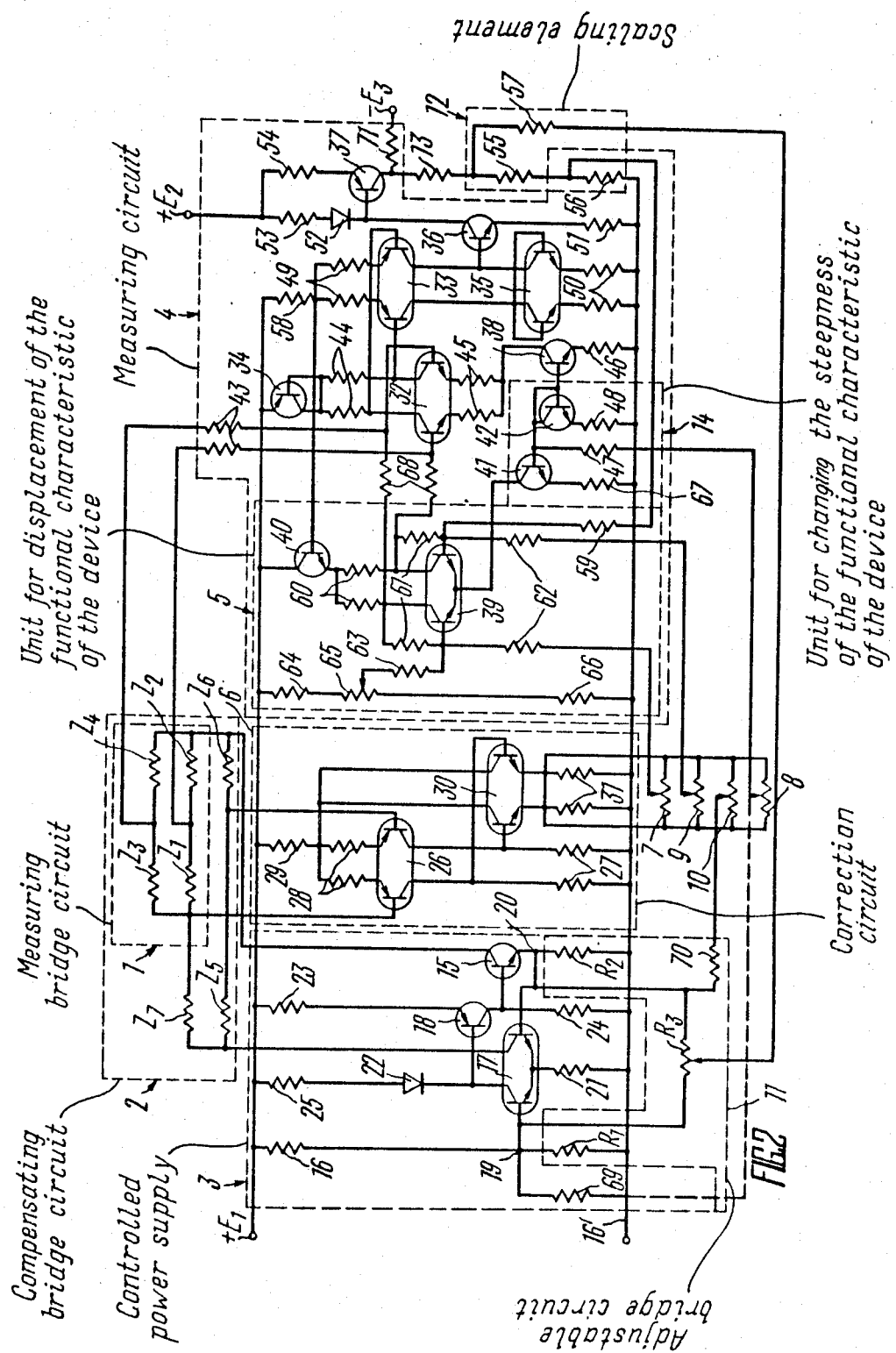

DEVICE FOR CONVERSION OF NON-ELECTRICAL QUANTITY INTO ELECTRICAL SIGNAL

FIELD OF THE INVENTION

The present invention relates to measuring equipments and, in particular, to devices for conversion of nonelectrical quantities into electrical signals.

This invention can be used in equipment for automatic control of technological processes, for example, in heat-and-power parameter sensors comprising transducers of non-electrical quantities into electrical signals. Such nonelectrical quantities may be pressure, displacement, strain, temperature.

PRIOR ART

Known in the art is a device (U.S. Pat. No. 3,646,815 Cl. 73/398, 1972) for conversion of strain of a resilient transducer element into a current output signal, which comprises one strain gauge and two temperature-sensitive resistors built around one common element, resistance-to-voltage transducer built around two identical controllable current sources, a voltage-to-current converter, a voltage stabilizer and a feedback device. Identical controllable current sources are similarly coupled to the outputs of the voltage stabilizer via load elements. The load element of one source is a resistance strain gauge, of the other - a temperature-sensitive resistor. Control inputs of current sources are coupled to the output of a divider connected to the outputs of the voltage stabilizer. One arm of the divider comprises one more temperature-sensitive resistor.

In this manner there is provided a differential circuit of the device to convert the resistance of the strain gauge into voltage. The output signal of the circuit is the voltage across connection points of current sources and said load resistors.

A function compensating temperature induced variations of the initial signal is shaped in the temperature-sensitive resistor coupled to the output of the voltage stabilizer.

Temperature induced variations of the signal are compensated by the function produced in the temperature sensitive resistor inserted into a divider by way of changing the current flowing through the strain gauge. The output of the resistance-to-voltage transducer is connected to an input of the voltage-to-current converter whose outputs are coupled to inputs of the voltage stabilizer. The input of the voltage stabilizer is connected via inputs of the feedback device to the terminals of the DC power supply. The output of the feedback device is connected to the input of the voltage-to-current converter. The resulting circuit of a strain gauge produces an output signal which is the current fed to the device from the power supply.

Insufficient accuracy of the known device can be accounted for by weak output signal of the circuit equipped with one active strain gauge and by fluctuation of current difference between two controlled current sources.

Moreover, scaling of temperature compensation signals applied to the characteristic of the device can seriously influence on the parameters of this characteristic in conventional, that is normal conditions. This can also reduce the accuracy of the device and functioning of the temperature compensation mechanism.

The closest prototype of the proposed device, as far as technical concept and produced effect is concerned, is a compensated strain gauge (USSR Inventor's Certificate 430,277 filed 1971) comprising measuring and compensating bridge circuits, a voltage-to-current converter, a controlled voltage stabilizer equipped with a master divider.

The compensating bridge circuit comprises one thermistor, three resistors and a feedback resistor.

The measuring bridge circuit comprises four resistance strain gauges having differential tensity resistive effect, a compensating resistor and a feedback resistor.

The supply arm of the measuring bridge circuit is connected to the output of a voltage stabilizer, whereas the measuring arm thereof is connected to the input of the voltage-to-current converter whose output is connected via an output load to the connection point of the feedback resistor and the resistance strain gauge of the measuring bridge circuit. The feedback resistor is placed between the center of the supply arm and one of the resistance strain gauges of the measuring bridge circuit.

The supply arm of the compensating bridge circuit is inserted as one of the arms of the master divider whose output is connected to the control input of the voltage stabilizer.

The measuring arm of the compensating bridge circuit is connected to the input of a correcting voltage-to-current converter whose one output is connected to the connection point of the feedback resistor and one of the resistors of the compensating bridge circuit.

The feedback resistor of the compensating bridge circuit is placed between the center of the supply arm thereof and one of the resistors. Another output of the correcting converter is coupled to the connection point of the compensating resistor and one of the resistance strain gauges of the measuring bridge circuit. The compensating resistor is placed between the center of the supply arm and one of the resistance strain gauges of the measuring bridge circuit.

In the known strain gauge the influence of temperature is compensated by changing the output current of the correcting converter directly involved in these effects. When said current flows through the compensating resistor of the measuring bridge circuit, the initial output signal is altered less, whereas, when said current flows through the elements of the master divider of the voltage stabilizer, the output signal temperature induced variations become less.

Insufficient accuracy and difficult adjustment procedure of this device can be attributed to the following reasons:

(a) scaling of temperature compensation of the initial output signal variations and of the output signal range of variation are interdependent, cannot be realized separately and change significantly said parameters of the characteristic of the device in normal conditions;

(b) reversal of compensating signals, which may become necessary with the change of sign of an error of the initial output signal and the range of fluctuation of said output signal, cannot be realized without rearranging the circuit;

(c) no provision is made for compensation of nonlinearity of the functional characteristic of the device, which should be there because of non-linearity of the real sensing elements and transducers;

(d) introduction of scaling elements, temperature compensation elements and feedback components into the measuring bridge disrupts its construction integrity, which is detrimental for reliability and noise immunity of the device;

(e) compensation can only be truly effective when physical properties of thermistors and resistance strain gauges in the measuring bridge are very close.

BRIEF DESCRIPTION OF THE INVENTION

It is an object of this invention to provide a device for conversion of a nonelectrical quantity, which is the parameter being measured, into an electrical signal in order to make measurements of nonelectrical quantities more accurate and adjustment of transducers easier.

The present invention resides in that in a device for conversion of a nonelectrical quantity into an electrical signal comprising measuring and compensating bridge circuits whose supply arms are electrically connected to a controlled power supply, a measuring arm of the measuring bridge circuit wherein the electric signal corresponding to the nonelectrical quantity is produced is connected to an input of a measuring circuit which alters the level of the output electrical signal and comprises a unit for displacement of the functional characteristic of the device, whereas the measuring arm of the compensating bridge circuit is connected to the input of a correcting circuit, according to the invention, the measuring bridge circuit is inserted as one arm of the compensating bridge circuit wherein a correction signal for the initial amplitude and steepness of the functional characteristic of the device is produced, other arms of said circuit being elements whose impedances are not functions of the nonelectric quantity being converted, the correction circuit has differential outputs connected to adjustable dividers which are intended to compensate variations of the initial amplitude of the functional characteristic of the device and whose number is to match the number of required corrections of the initial amplitude of the functional characteristic of the device and which are coupled to a control input of a device functional characteristic displacement unit, and adjustable dividers which are intended to compensate variations of the steepness of the functional characteristic of the device and whose number is to match the number of required corrections of the steepness of the functional characteristic of the device and which are coupled to a device functional characteristic scaling circuit.

A controled power supply should be conveniently used as a circuit for scaling the functional characteristic of the device, at least one control input thereof being connected to the output of one adjustable divider designed to compensate variations in the steepness of the functional characteristic of the device.

It is also advisable that the measuring circuit should comprise a unit for changing the steepness of the functional characteristic of the device used as the scaling circuit of the functional characteristic of the device, at least one control input thereof being connected to the output of one adjustable divider designed to compensate variations of the steepness of the functional characteristic of the device.

The device should possibly comprise a scaling element inserted into the output circuit of the device, whose output is electrically connected to a circuit for scaling the functional characteristic of the device.

It is further possible that the device contains an adjustable bridge circuit whose one arm is connected to the output of the scaling element, whereas the other arm is connected to the control input of the controlled supply arm used as a scaling circuit for the functional characteristic of the device.

It is quite feasible that the measuring circuit comprises a unit for changing the steepness of the functional characteristic of the device used as a scaling circuit of the functional characteristic of the device, wherein the control input is connected to the output of the scaling element.

The use of the impedance of the measuring bridge circuit as the source of the correction signal permits elimination of specifically introduced elements for measuring the magnitude of destabilizing factors, more accurate error reduction at the expense of greater similitude between the parameter destabilization function and parameter compensation (correction) function of the characteristic.

Elimination of adjustment elements from the measuring and compensating bridge circuits permits cancelling of the effects of adjustment of elements upon amplitudes of unadjustable parameters of the device characteristic, which makes the whole adjustment process easier and more accurate.

The use of a correction circuit featuring differential outputs coupled to adjustable dividers permits doing without rearrangement of elements for reversal of corrections, which makes correction of destabilizing factors more accurate and technologically effective. It also permits elimination of errors caused by a variety of destabilizing factors, which makes adjustment more efficient and the device more stable in operation.

The accuracy of the device is also improved through compensation of non-linearity with the aid of an adjustable bridge circuit.

BRIEF DESCRIPTION OF DRAWINGS

The invention will now be described in detail, taken in conjunction with the accompanying drawings, wherein:

FIG. 2 illustrates a schematic circuit of a device for conversion of a nonelectrical quantity into an electrical signal, according to the invention.

Figure 1:
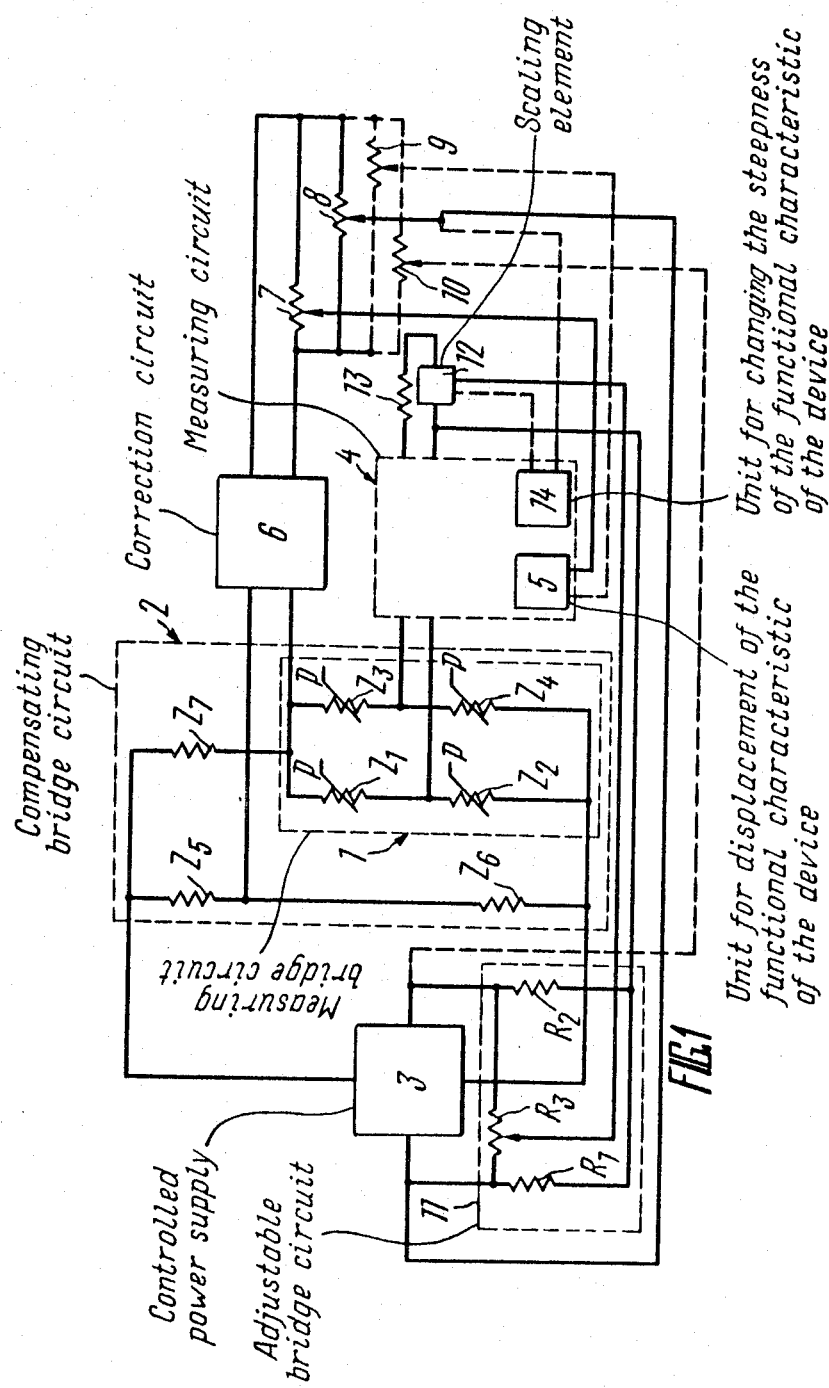
FIG. 1 illustrates a skeleton diagram of a device for conversion of a nonelectrical quantity into an electrical signal, according to the invention.

A device for conversion of a nonelectrical quantity into an electrical signal comprises a measuring bridge circuit 1 (FIG. 1) and a compensating bridge circuit 2 whose supply arms are electrically connected to a controlled power supply 3 which is used as a device functional scaling circuit. The measuring arm of the measuring bridge circuit 1 is connected to an input of a measuring circuit 4 for varying the level of the electrical signal. The circuit 4 comprises a device functional characteristic displacement unit 5. The measuring arm of the compensating bridge circuit 2 is connected to an input of a correction circuit 6 having differential outputs connected to adjustable dividers 7, 8, 9 and 10. Outputs of the adjustable dividers 7, 9 and 8,10 are connected to control inputs of the device functional characteristic displacement unit 5 and of the controlled power supply 3 respectively. The number of adjustable dividers is equal to the number of correction steps for the functional characteristic of the device. In this embodiment four adjustable dividers 7, 8, 9 and 10 are used. In general, the number of adjustable dividers depends on the number of suitable corrections. The measuring bridge circuit 1 is incorporated into the compensating bridge circuit as one of the arms thereof.

The measuring bridge circuit 1 comprises elements $Z_1, Z_2, Z_3, Z_4$ whose impedances vary with the nonelectrical quantity being converted. The compensating bridge circuit comprises elements $Z_5, Z_6, Z_7$ whose impedances do not vary with the nonelectrical quantity being measured or with other destabilizing factors.

The device for conversion of a nonelectrical quantity into an electrical signal also comprises an adjustable bridge circuit 11 and a scaling element 12 incorporated into the output circuit of the device, which comprises a load 13. The output of the scaling element 12 is connected to one of the arms of the adjustable bridge circuit 11 whose other arm is connected to control inputs of the controlled power supply 3.

The adjustable bridge circuit 11 comprises elements $R_1$ and $R_2$ forming two arms of said bridge circuit 11. Two other arms of said circuit are formed between the movable contact of an element $R_3$ and points where said contact is joined to the elements $R_1$ and $R_2$.

The measuring circuit 4 can comprise a unit 14 for changing the steepness of the functional characteristic of the device, which is used as a device functional characteristic scaling unit whose one control input is connected to an output of at least one adjustable divider 8. The other control input of the unit 14 is connected to an output of the scaling element 12.

Referring to FIG. 2, the schematic shows the circuit of the proposed device when it is used to measure strain with the aid of semiconductor strain gauges which are elements $Z_1, Z_2, Z_3$ and $Z_4$ of the measuring bridge circuit 1 being an arm of the compensating bridge circuit 2. Other arms of this circuit are film and wirewound resistors which are elements $Z_5, Z_6$ and $Z_7$ whose resistances do not appreciably vary under the influence of such destabilizing factors as temperature, electromagnetic field or aging of the elements.

The supply arm of the compensating bridge circuit is connected between the positive bar $+E_1$ carrying DC stabilized voltage and the collector of an output transistor 15 of the controlled power supply 3.

The power supply 3 comprises a master divider built around resistors 16 and $R_1$, which is connected between the common bar $16^1$ and the bar $+E_1$, a mismatch amplifier built around transistors 17, 18, 15 and a feedback resistor $R_2$ connected between the emitter of the output transistor 15 and common bar $16^1$. Transistors 17 are the input stage of the mismatch amplifier.

Bases of the transistors 17 are connected between an output 19 of the master divider and a connection point 20 of the resistor $R_2$ and the emitter of the output transistor 15. Emitters of the transistors 17 are connected to the bar $16^1$ via a current stabilizing resistor 21. The collector of the right transistor 17 is connected to the bar $+E_1$, whereas the collector of the left transistor 17 is connected to the cathode of a compensating diode 22 and the base of the transistor 18 whose emitter is connected via a resistor 23 to the bar $+E_1$ and whose collector is connected via a resistor 24 to the bar $16^1$. The anode of the diode 22 is connected via a resistor 25 to the bar $E_1$. The base of the output transistor 15 is connected to the collector of the transistor 18. The resistors $R_1$ and $R_2$ incorporated between the bases of the transistors 17 and the bar $16^1$ form two arms of the adjustable bridge circuit 11 whose two other arms are formed between the movable contact of the variable resistance $R_3$ and points where it is connected to the bases of the transistors 17. The movable contact of the resistor $R_3$ is connected to the output of the scaling element 12 inserted into the circuit of the load 13.

The measuring arm of the compensating bridge circuit is connected to the input of the correction circuit 6, which is the bases of transistors 26 whose collectors are connected via equal resistors 27 to the bar $16^1$, whereas the emitters are connected via equal resistors 28 to one another. The connection point of the resistors 28 is coupled via a current-setting resistor 29 to the bar $+E_1$.

Collectors of the transistors 26 are connected to the bases of transistors 30 whose emitters are coupled via equal resistors 31 to the bar $16^1$ and whose collectors are coupled to the connection point of the emitter resistors 28.

Emitters of the transistors 30 are differential outputs of the correction circuit 6. Adjustable dividers 7, 8, 9 and 10 are inserted between said outputs.

The measuring circuit 4 has, apart from the amplifying circuit composed of transistors 32, 33, 34, 35, 36, 37, 38, a unit 5 for shifting the functional characteristic of the device, comprising transistors 39 and 40 and the unit 14 for changing the steepness of the functional characteristic of the device, which comprises transistors 41 and 42.

The measuring arm of the measuring bridge circuit 1 is connected via equal resistors 43 to bases of the transistors 32 whose collectors are coupled through equal resistors 44, whereas emitters are coupled through equal resistors 45. The connection point of the collector resistors is connected to the cathode of the diode formed by coupling the base with the collector of the transistor 34 whose emitter is the anode of said diode and is connected to the bar $+E_1$.

The connection point of the emitter resistors 45 is connected to the collector of the transistor 38 whose emitter is connected via a resistor 46 to the bar $16^1$, whereas the base thereof is connected to an output of a current-setting divider formed by a resistor 47 and the diodecoupled transistor 42 and a resistor 48, the two latter being connected in series.

Collectors of the n-p-n transistors 32 are connected to bases of the p-n-p transistors 33 whose emitters are joined via equal resistors 49, whereas the collectors thereof are connected to collectors of the n-p-n transistors 35. Emitters of the transistors 35 are connected via equal resistors 50 to the bar $16^1$, the bases thereof being connected to the collector of the left transistor 35. The point of connection of collectors of the right transistors 33 and 35 is connected to the base of the transistor 36 whose emitter is connected via a resistor 51 to the bar $16^1$ and whose collector is connected via a compensating diode 52 and a resistor 53 to an emitter resistor 54 of the output current-regulating transistor 37 whose base is connected to the collector of the transistor 36. Collector of the transistor 37 and the bar $16^1$ are outputs of the adjustable current source, the load 13 and scaling elements-resistors 55, 56 and 57 being placed therebetween. The point of connection of the resistors 53 and 54 is joined to the bar $+E_2$. The point of connection of the resistors 49 is joined to the base of the transistor 40 and via a resistor 58 to the bar $+E_1$.

The point of connection of the load 13 and the resistor 55 is joined via the resistor 57 to the slider of the variable resistance $R_3$. The point of connection of resistors 55 and 56 is connected via a resistor 59 to the base of the right transistor 39.

The characteristic shifting unit 5 is built as an adder around transistors 39 whose emitters are coupled to the collector of the current-setting transistor 41. Collectors of the transistor 39 are joined via resistors 60 and the point of connection thereof is coupled to the emitter of the transistor 40 whose collector is coupled to the bar $+E_1$. Collectors of the transistors 39 are coupled via equal feedback resistors 61 to respective bases of said transistors 39.

Bases of the transistors 39 are coupled via input resistors 62 to outputs of adjustable dividers 7 and 9 and via a resistor 63 to the output of the master divider inserted between the bars $+E_1$ and $16^1$ and composed of series-connected resistors 64, 65, 66.

Emitter of the transistor 41 is coupled via a current-setting resistor 67 to the bar $16^1$.

Collectors of the transistor 39 are coupled to bases of the transistors 32 via equal resistors 68.

The output of the adjustable divider 8 is connected, depending on the chosen circuit of scaling the functional characteristic of the device, either to the control input of the unit 14, that is the resistor 47, or to the control input of the power supply 3, that is the resistor 69 whose other lead is coupled to the base of the transistors 17.

The output of the adjustable divider 10 is coupled to another control input of the power supply 3, which is a lead of a resistor 70 whose other lead is coupled to the base of the transistors 17.

Displacement current is fed to the load 13 via a resistor 71 from the voltage source $-E_3$ in order to furnish a suitable output current variation zone in the zero value area.

To correct or compensate errors of the functional characteristic of the device caused by a variety of destabilizing factors use is made of the relationship existing between the impedances of elements of the measuring bridge circuit 1 (FIG. 1) and sensitivity of elements of said measuring bridge circuit 1 with the nonelectrical quantity, the parameter being measured, as well as between said impedances and the initial unbalance existing between said impedances. There is a possibility to correct errors stemming from all destabilizing factors which alter impedances of the elements of the measuring bridge circuit 1. Such factors may be temperature, electrical or magnetic field, aging of components.

In the absence of a nonelectrical quantity the impedances of the elements $Z_1, \ldots, Z_4$ are balanced so that the signal available in the measuring arm of the measuring bridge circuit 1 is close to zero. In this case the output signal is set to a specific initial amplitude by means of a unit 5 for shifting the functional characteristic of the device.

As the measured parameter alters, impedances of diagonal pairs of elements $Z_1$–$Z_4$ or $Z_2$–$Z_3$ change in one direction, whereas impedances of the half-bridge pairs of elements $Z_1$–$Z_2$ or $Z_3$–$Z_4$ change in different directions. Here the active, that is sensitive to the measured parameter, component is either one pair of elements or all elements $Z_1 \ldots Z_4$.

As a result a signal appears in the measuring arm of the measuring bridge circuit. The amplitude of the signal depends on the sensitivity of elements $Z_1 \ldots Z_4$ to the measured parameter, the strength of this parameter and the magnitude of the supply parameter of the measuring bridge circuit 1 (voltage or current).

The signal of the measuring bridge circuit 1 is converted by the measuring circuit 4 into an output signal produced at the load 13.

Amplitudes of the input and output signals are matched by scaling the device, which depends on the voltage or current level of the power supply 3 and the transmission factor of the measuring circuit 4.

The compensating bridge circuit is balanced so that signals at differential outputs of the correction circuit 6 are equal. Voltage drop across the adjustable dividers 7, 8, 9, 10 are equal to zero. Signals at the outputs of said dividers are, therefore, independent of the position of sliders thereof.

The action of some destabilizing factor changes the impedances of the elements of the measuring bridge circuit 1 and, consequently, the impedance of the supply arm thereof and causes signals to appear at the output of the measuring arm of the compensating bridge circuit 2 and, consequently, at the outputs of the correction circuit 6. The amplitude and phase of said signals are explicit functions of the strength and direction of a destabilizing factor.

At the output of the adjustable dividers 7, 8, 9, 10, however, the amplitude and phase of signals depends on the division ratio selected for each such divider. They can be adjusted within the limits of from the amplitude and phase of the signal at one differential output to the amplitude and phase of the signal at the other differential output, the neutral position being passed with the division coefficient $K_q=0.5$. Output signals of the adjustable dividers 7, 8, 9 and 10 are further supplied to the control inputs of the power supply 3 and units 5 and 14 which control two parameters of the functional characteristic - displacement and steepness. Any change in the displacement of the functional characteristic of the device (zero drift) is corrected or compensated by scaling the signal fed from the output of the dividers 7 and 9 to the unit 5. Any change in the output signal range (sensitivity of the device), as well as non-linearity of the output signal are compensated by scaling the signals fed from the outputs of the dividers 8 and 10 to the control inputs of the power supply 3.

When the measuring circuit 4 is equipped with a unit 14 for changing the steepness of the functional curve, the control inputs thereof can be coupled to:

(a) the output of the scaling element 12 to correct the non-linearity of the output signal;

(b) the output of the adjustable divider 8 to correct the range of variation of the output signal.

Scaling of signals delivered from the outputs of the adjustable dividers 7, 8, 9 and 10 is done in case a destabilizing factor (dynamic or static) affects the measuring bridge circuit 1 or the device as such so that changes of parameters of the functional characteristic of the device are compensated with a suitable accuracy. A specific relationship is consequently established between the function of variations of the parameter being measured and the function of compensation of said variation. Further on this relationship is automatically operating and compensates the effect of destabilization on the amplitude and phase (sign) of the parameters of the functional characteristic of the device.

The number of adjustable dividers depends on the number of parameters of the functional characteristic of the device to be stabilized, the number of destabilizing factors and the degree of correlation between various destabilizing factors. The weaker the correlation between some factors, the more imperative the use of an independent correction for each such factor, that is the use of an independent adjustable divider specifically scaled to correct variations of parameters of the functional characteristic of the device caused by this particular destabilizing factor.

Thus, the influence of temperature and aging of components upon the initial amplitude of the output signal can be substantial and varied. In this case specifically scaled signals are to be applied to the control inputs of the unit 5 from different dividers 7 and 9.

In this manner the proposed device provides for elimination of errors caused by a variety of destabilizing factors, irrespective of the degree of correlation between said factors.

By virtue of separation of a destabilizing function effect upon the impedances of the measuring bridge circuit in the measuring arm of the compensating bridge circuit, it is no longer necessary to make use of suitable elements sensible to destabilizing factors and a great degree of similitude and fast response between functions is achieved. The measuring and compensating bridge circuits 1 and 2 have no scaling elements and this permits elimination of influence of scaling of corrections upon the parameters of the functional characteristic of the device in the absence of said corrections.

The compensating signal can be regulated, as far as the amplitude and phase is concerned, by means of only one adjustment element, which is an adjustable divider. This helps to avoid rearrangement of these elements when reversal of correction is required. Moreover, no matching should be done as with several adjusting elements. Since in the absence of destabilizing factors the signals at differential outputs of the correction circuit 6 are equal, the signals supplied from the outputs of the adjustable dividers 7, 8, 9, 10 are independent of the position of the sliders thereof. This means that selection of any division factor has no effect upon the parameters of the functional characteristic of the device when there are no destabilizing inputs. It is, therefore, no longer necessary to match parameters and corrections.

The above features of the proposed device provide for better accuracy in conditions of multifactor destabilization and technological efficiency of adjustment operations.

Compensation of nonlinearity of the functional characteristic of the device by means of connection of one output of the adjustable dividers 8 and 10 to the control input of the power supply 3 or the unit 14 can only be realized when alteration of the measured parameter results in substantial change of impedance of the measuring bridge circuit 1. Such substantial change can be attained if semibridge elements $Z_1$-$Z_2$ and $Z_3$-$Z_4$ change differently or if only one pair of diagonal elements $Z_1$-$Z_4$ or $Z_2$-$Z_3$ changes. In consequence, when impedance changes of elements $Z_1$-$Z_2$ and $Z_3$-$Z_4$ are differential and well balanced, the scaling element 12 is coupled to the unit 14 or via the adjustable bridge circuit 11 to the power supply 3 for correction of nonlinearity of the functional characteristic of the device.

The use of the bridge circuit 11 whose input is connected to the output of the scaling element 12 provides for change of amplitude and sign of a correction of nonlinearity of the functional characteristic of the device without rearrangement of circuit components, as well as suitable independence of the correction scaling from the supply parameter scaling. This also makes the device more accurate and adjustment operations more efficient.

This embodiment of the proposed device is designed to convert the strain of semiconductor strain gauges -elements $Z_1$ (FIG. 2), $Z_2$, $Z_3$ joined into a measuring bridge circuit - into a unified current signal. High sensitivity of strain gauges provides for adequately accurate conversion of impedances of the measuring bridge circuit 1 into an output signal of a DC supplied device. Such devices can be further miniaturized, have low power requirements, are highly reliable and ensure spark safe operation.

The compensating bridge circuit 2 and the measuring bridge circuit 1 operate from a controlled power supply 3 whose outputs are bar $E_1$ and collector of the transistor 15. Current of the power supply 3 is stabilized by deep negative feedback realized through the resistor $R_2$. The difference between the reference voltage from the output 19 of the master divider and the voltage at the resistor $R_2$ is phase inverted and amplified by the transistors 17 and 18 so that the voltage of $R_2$ is kept equal to the voltage of $R_1$ with a high degree of accuracy. Variations of the current flowing through $R_2$ result in variations of the current passing through the compensating bridge circuit 2 with an accuracy conditioned by the difference of current variations of the bases of the transistors 15 and 17. This current, consequently, is maintained at a constant level which depends on the voltages of $R_1$ and $R_2$. These voltages depend on the totality of control currents added in said resistors. Thus, resistor $R_1$ adds up currents passing through the resistors 16, 69, 57 and the left portion of the resistor $R_3$, whereas resistor $R_2$ adds up currents passing through the transistor 15, resistors 70, 57 and the right portion of the resistor $R_3$. In this manner the supply current of the compensating and measuring bridge circuits 2 and 1 is stabilized and controlled in the proposed device.

The voltage in the measuring arm of the compensating bridge circuit 2 is amplified by the correction circuit 6 built around the transistors 26 and 30. Voltage gain is assigned by the ratio of resistances of the resistors 27 and 28. Since currents change in opposite direction in the left and right portions of the transistors 26 and 30, a single-phase input signal, either positive or negative, which corresponds to a certain change of the impedance of the supply arm of the measuring bridge circuit 1 is converted into a two-phase signal which is inverted at one output of the correction circuit 6 and non-inverted at the other output thereof. Negative feedback voltage is produced at the resistor 29 in order to stabilize in-phase currents passing through the transistors 26 and 30 and, consequently, the amplifying properties of said transistors. The use of emitter followers of the transistors 30 makes matching of the output resistance of the correction circuit 6 with the multitude of resistances of the adjustable dividers 7, 8, 9, 10 much easier. Also easier becomes matching of resistances of said followers with input resistances of circuit units coupled therewith.

When no strain influences on the elements $Z_1, \ldots Z_4$, the voltage existing in the measuring arm of the measuring bridge circuit 1 is due to the difference of ratios between the initial values of $Z_1, Z_2, Z_3, Z_4$, namely $$Z_3/(Z_3+Z_4) \text{ and } Z_1/(Z_1+Z_2)$$

The influence of the measured parameter p is transmitted to the elements $Z_1, \ldots, Z_4$ so that the resistance of one of diagonal pairs $Z_1$-$Z_4$, $Z_2$-$Z_3$ grows, whereas resistance of the other pair diminishes. A voltage which is the function of the measured parameter p consequently appears in the measuring arm of the measuring bridge circuit 1. The conversion ratio in this case is determined by the product of resistances of the elements $Z_1, \ldots, Z_4$, which have changed due to strain, by the current passing therethrough. The voltage from the measuring arm of the measuring bridge circuit 1 is converted into the difference of collector currents in the first stage of the measuring circuit 4 built around the transistors 32, 34, 38 in a differential amplifier circuit. The supply current of the stage is stabilized by the transistor 38 and the negative feedback taken from the resistor 58 and passed over via the emitter junction of the transistor 40 and the resistors 60 and 68 to the input if said stage. The difference of collector currents of the transistors 32 is amplified and inverted by the transistors 33 and 35 so that the current of the base of the transistor 36 is conditioned by opposite changes of collector currents of the right portions of the transistors 33 and 35. Transistors 36 and 37 further amplify the current ensuring a suitable steepness. The magnitude of voltage in the bar $+E_2$ is determined by the total voltage of the resistors 55, 56 and the load 13 so that the transistor 37 is not saturated in the operational range of output currents and, in the general case, can be unlike saturation in the bar $+E_1$. Destabilizing effect of possible fluctuations of the voltage $+E_2$ upon the output current is reduced considerably by collector junctions of the transistors 36 and 37.

The current of the collector of the transistor 37 is the output current of the device. This current flows through the feedback resistor 56 and produces a voltage therein, which is proportional to the output signal. This voltage is supplied to one input of the characteristic displacement unit 5, in this case the resistor 59. The unit 5 is built as a symmetrical adder equipped with deep negative feed-back realized through resistors 61.

The symmetry of the adder is accounted for by the fact that the resistances of the left and right parts of the circuit are equal. This results in a relatively high stability of the voltage drop across collectors of the transistors 39. Collector voltage drop of transistors 39 is the output adder signal and is proportional to the sum of input voltages of the adder: that is, the voltage regulating the initial amplitude of the output signal, the voltage removed from the slider of the resistor 65, the feedback voltage taken from the resistor 56 and correction voltages taken from the adjustable dividers 7 and 9. The amplification factor of each input depends on respective input resistance, that is the resistances of the resistors 63, 59 and 62.

The amplification factor of the adder also depends on the current of emitters of transistors 39, which is assigned by the collector current of the transistor 41, which in turn is assigned by the voltage delivered from the output of the adjustable divider 8 which controls the unit 14 for changing the steepness of the functional characteristic of the device.

Collector voltage drop of transistors 39 acts via the resistors 68 upon the bases of the transistors 32 so that to compensate the effect of variations of voltage of the measuring arm of the measuring bridge circuit 1, which is passed on via the resistors 43.

In this way the input of the measuring circuit 4 receives, apart from the signal of the measuring bridge circuit 1, which comprises conversion errors, compensating signals of the feedback and correction signals.

The functional characteristic of the device is scaled by selecting the amplitude of the stabilized supply current, which is attained by setting the resistance of the resistor 16, selecting the steepness of the measuring circuit 4 by setting a specific power supply condition and amplification factor for the adder built around the transistor 39, as well as by setting the rating of the resistance of the feedback resistor 56.

Non-linearity of the characteristic of the elements $Z_1, \ldots Z_4$ is compensated by automatic control of the stabilized supply current of the measuring bridge circuit 1 by means of the output current of the measuring circuit 4. Control current proportional to the output current is assigned by the scaling element 12 built around resistors 55, 56, 57 and the redistribution thereof between the resistors $R_1$ and $R_2$ is done by selecting the position of the slider of the resistor $R_3$ so that non-linearity of the functional characteristic is brought to the minimum. If the slider of the resistor $R_3$ is shifted to the left, the functional characteristic (curve) bends downwards and vice versa. In this case the change of sign of the compensating signal requires no rearrangement of the circuit elements and additional adjustments.

The initial amplitude of the output signal is adjusted by selection of position of the slider of the resistor 65 which regulates voltage at one input (resistor 63) of the adder and, consequently, at the bases of the input transistor 32 of the measuring circuit 4.

Destabilization of parameters of the functional characteristic of the device is compensated by automatic control of the scaling circuit and the unit 5 at the expense of changing the impedance of the supply arm of the measuring bridge circuit 1. Provision is made for stabilization of two parameters of the functional characteristic of the device: The initial magnitude of the output signal 9 (via adjustable dividers 7 and 9) and the steepness of the signal (via adjustable dividers 8 and 10) for two destabilizing factors.

The device functional characteristic scaling circuit is controlled both by controlling the stabilized supply current via the adjustable divider 10 and by control of the unit 14 via the adjustable divider 8.

In the absence of destabilizing factors the compensating bridge circuit 2 is balanced so that there is no voltage in the measuring arm thereof. In this case voltage is equal and constant at the outputs of the correction circuit 6 and, consequently, at sliders of the adjustable dividers 7, 8, 9, 10 irrespective of their position. This means that there is no connection between the position of sliders (the sign and scale of the correction) and the magnitude of parameters of the functional characteristic of the device.

If the slider of the adjustable divider 7, 8, 9 or 10 is in the middle position, the voltage thereon does not depend on variations of voltages at differential outputs of the circuit 6 and, consequently, there is no connection between the impedance of the measuring bridge circuit 1 and a control input, of the scaling circuit for example, coupled to the slider. When the slider of the adjustable divider 7, 8, 9 or 10 is shifted to the right from the middle, the voltage thereon changes in the same direction as the impedance of the measuring bridge circuit 1, and, on the contrary, when the slider is shifted to the left, the voltage changes in the opposite direction as compared to the impedance of the measuring bridge circuit 1. Here the output voltage of the adjustable divider 7, 8, 9 or 10 is proportional to the length of shift of the slider from the middle.

Under the influence of a destabilizing factor the voltage at the outputs of the correction circuit 6 changes differentially and in accordance with the changing impedance of the measuring bridge circuit 1. Here any change in a parameter of the functional characteristic of the device can at any time be corrected by shifting a slider of a respective adjustable divider and resettng the initial value (without destabilization).

Since the nature of changes of parameters of the functional characteristic and of impedance of the measuring bridge circuit is similar, resetting initial parameters corresponds to stabilization of said parameters within a wide range of destabilizing factors.

What is claimed is:

1. A device for conversion of a nonelectrical quantity into an electrical signal comprising:
    a measuring bridge circuit for forming an electrical signal corresponding to the nonelectrical quantity being converted;
    said measuring bridge circuit including arms, which are elements whose impedances change under the influence of the nonelectrical quantity;
    one of said arms being a supply arm of said measuring bridge circuit;
    another of said arms being a measuring arm of said measuring bridge circuit;
    a compensating bridge circuit for forming a signal to correct the initial amplitude and steepness of the functional characteristic of the device;
    first, second third and fourth arms of said compensating bridge circuit;
    said measuring bridge circuit being said first arm of said compensating bridge circuit;
    said other arms of said compensating bridge circuit being elements whose impedances are not functions of said nonelectrical quantity being converted;
    one of said other arms being a supply arm of said compensating bridge circuit;
    another of said other arms being a measuring arm of said compensating bridge circuit;
    a controlled power supply providing passage of current through said elements of said measuring and compensating bridge circuits and including control inputs;
    said supply or arms of said measuring and compensating bridge circuits, connected to said controlled power supply;
    a measuring circuit for measuring the level of the electrical signal and including an input and an output;
    a load forming an output circuit connected to said output of said measuring circuit;
    a unit for displacement of the functional characteristic of the device of said measuring circuit for regulation of the initial amplitude of the output signal of the device, said unit including a control output;
    said measuring arm of said measuring bridge circuit, being connected to said input of said measuring circuit;
    a circuit for scaling the functional characteristic of the device;
    a correction circuit for conversion of the signal taken from said measuring arm of said compensating bridge circuit into a control signal for said unit for displacement of the functional characteristic of the device and for the circuit for scaling the functional characteristic of the device, said correction circuit including an input and differential outputs;
    said measuring arm of said compensating bridge circuit, connected to said input of said correction circuit;
    at least one first adjustable divider intended for compensation of variations of the initial value of the functional characteristic of the device, the number of said correction circuits being determined by the number of required corrections of the initial value of the functional characteristic of the device, said correction circuits being connected to said input of said unit for displacement of the functional characteristic of the device; and
    at least one second adjustable divider intended for compensation of variations in the steepness of the functional characteristic of the device, each second adjustable divider including an output, the number of said second adjustable dividers being determined by the number of required corrections of the steepness of the functional characteristic of the device, said second adjustable dividers being connected to said circuit for scaling the functional characteristic of the device.

2. A device as claimed in claim 1, wherein said circuit for scaling the functional characteristic of the device, which is said controlled power supply, at least one of said control inputs of said controlled power supply being connected to the output of one said second adjustable divider intended for compensation of variations of the steepness of the functional characteristic of the device.

3. A device as claimed in claim 1, comprising:
    a unit for changing the steepness of the functional characteristic of the device and including control inputs;
    said circuit for scaling the functional characteristic of the device, which is said unit for changing the steepness of the functional characteristic of the device; and
    at least one of said control inputs of said unit for changing the steepness of the functional characteristic of the device being connected to the output of one said second adjustable divider intended for compensation of variations of the steepness of the functional characteristic of the device.

4. A device as claimed in claim 1, comprising:
    a scaling element inserted into said output circuit and including an output; and
    said output of said scaling element electrically connected to said circuit for scaling the functional characteristic of the device.

5. A device as claimed in claim 4, comprising:
    an adjustable bridge circuit including a first and second arms;
    said first arm of said adjustable bridge circuit being connected to said output of said scaling element; and
    said second arm of said adjustable bridge circuit being connected to one of said inputs of said controlled power supply which includes a circuit for scaling the functional characteristic of the device.

6. A device as claimed in claim 4, comprising:
    said measuring circuit including a unit for changing the steepness of the functional characteristic of the device, which is said circuit for scaling the functional characteristic of the device;
    said unit for changing the steepness of the functional characteristic of the device including an input; and
    said input of said unit for changing the steepness of the functional characteristic of the device being connected to said output of said scaling element.

* * * * *